(12) United States Patent
Hsu et al.

(10) Patent No.: US 8,941,106 B2
(45) Date of Patent: Jan. 27, 2015

(54) DISPLAY DEVICE, ARRAY SUBSTRATE, AND THIN FILM TRANSISTOR THEREOF (71) Applicant: E Ink Holdings Inc., Hsinchu (TW)

(72) Inventors: Cheng-Hang Hsu, Hsinchu (TW); Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/688,223

(22) Filed: Nov. 29, 2012

(65) Prior Publication Data

US 2013/0270547 A1 Oct. 17, 2013

Related U.S. Application Data (60) Provisional application No. 61/623,556, filed on Apr. 12, 2012.

(30) Foreign Application Priority Data

Aug. 13, 2012 (TW) .............................. 101129209 A (51) Int. Cl.
H01L 29/10 (2006.01)
H01L 33/08 (2010.01)
H01L 29/786 (2006.01)
H01L 27/12 (2006.01)
H01L 29/423 (2006.01)

(52) U.S. Cl.
CPC .......... *H01L 33/08* (2013.01); *H01L 29/78672* (2013.01); *H01L 27/1222* (2013.01); *H01L 29/42384* (2013.01); *H01L 29/78642* (2013.01); *H01L 29/78696* (2013.01); *H01L 29/7869* (2013.01)
USPC .................................. 257/43; 257/66; 257/72

(58) Field of Classification Search
CPC ................... H01L 29/78672; H01L 29/78696; H01L 29/78642; H01L 29/7869; H01L 29/42384; H01L 33/08; H01L 27/1222
USPC .................................................. 257/43, 66, 72
See application file for complete search history.

(56) References Cited

U.S. PATENT DOCUMENTS

| 5,574,294 | A | 11/1996 | Shepard |
| 7,619,608 | B2 * | 11/2009 | Lee et al. ...................... 345/107 |
| 7,629,633 | B2 | 12/2009 | Chan et al. |
| 8,067,767 | B2 | 11/2011 | Yun et al. |
| 8,207,533 | B2 * | 6/2012 | Maekawa et al. ............... 257/59 |
| 2010/0025679 | A1 * | 2/2010 | Yamazaki et al. .............. 257/43 |

(Continued)

FOREIGN PATENT DOCUMENTS

| TW | 548849 B | 8/2003 |
| TW | 200500770 A | 1/2005 |
| WO | 2011065059 A1 | 6/2011 |

OTHER PUBLICATIONS

Corresponding TW Office Action that these art references were cited.

*Primary Examiner* — Trung Q Dang
(74) *Attorney, Agent, or Firm* — CKC & Partners Co., Ltd.

(57) ABSTRACT

A thin film transistor is provided. In this thin film transistor, the thickness of the gate is increased. Therefore, the source and drain of this thin film transistor can be disposed on the side wall of the gate to decrease the occupied area of the thin film transistor. An array substrate and a display device using the thin film transistor are also provided.

20 Claims, 5 Drawing Sheets

(56) References Cited

U.S. PATENT DOCUMENTS

| | | |
|---|---|---|
| 2011/0101337 A1 | 5/2011 | Yamazaki |
| 2011/0101356 A1 | 5/2011 | Yamazaki |
| 2011/0108909 A1 | 5/2011 | Weng et al. |
| 2012/0112194 A1* | 5/2012 | Ono et al. ............... 257/59 |
| 2012/0242624 A1* | 9/2012 | Tomiyasu et al. ......... 345/175 |

* cited by examiner

Fig. 3

DISPLAY DEVICE, ARRAY SUBSTRATE, AND THIN FILM TRANSISTOR THEREOF

CROSS-REFERENCE TO RELATED APPLICATION

This application claims the priority benefit of provisional application Ser. No. 61/623,556, filed Apr. 12, 2012, the full disclosure of which is incorporated herein by reference. This application also claims the priority benefit of Taiwan application serial no. 101129209, filed Aug. 13, 2012, the full disclosure of which is incorporated herein by reference.

BACKGROUND

1. Technical Field

The disclosure relates to display technology. More particularly, the disclosure relates to a display device, an array substrate, and a thin film transistor thereof.

2. Description of Related Art

One important specification of a planar display device is brightness, and the most important determining factor of the brightness is aperture ratio. Aperture ratio is a ratio of the effective area that light can pass through. Therefore, the more the aperture ratio is, the brighter the brightness of the display device is. One important affecting factor of the aperture ratio is the area occupied by a thin film transistor (TFT) of each pixel.

The present TFT technology horizontally disposes the gate, the semiconductor layer, the source and the drain on a substrate. Moreover, an opaque layer is disposed on the TFT to prevent the TFT from generating photocurrent, which can produce a current leakage problem. Therefore, the area occupied by the TFT in each pixel cannot transmit light, and the brightness of the display device is thus limited. That means, the more the area occupied by the TFT is, the smaller the aperture ratio is, and the lower the brightness of the display device is.

However, if the TFT performance is increased, for example, by increasing the width of the source and the drain to increase the current of the TFT to achieve a quicker charging and discharging rate, the area occupied by the TFT is increased, too. Then, the aperture ratio is further decreased.

At present, the size of the TFT can be significantly decreased after the discovery of metal oxide semiconductor material. However, the TFT still occupy relatively large pixel area.

SUMMARY

In one aspect, the present invention is directed to a thin film transistor for decreasing area occupied by TFT to increase aperture ratio of displays, and thus the brightness of the displays is increased, too.

An embodiment of the present invention discloses a thin film transistor having a gate, a gate insulating layer, a semiconductor layer, a source, and a drain. The gate is disposed on a substrate and has a first lateral surface connecting the substrate. The gate insulating layer is disposed on the gate. The semiconductor layer is disposed on the gate insulating layer and covers the first lateral surface of the gate. The source and the drain are respectively disposed on the semiconductor layer, located at two opposite sides of the semiconductor layer, and disposed on the first lateral surface of the gate.

In another aspect, an embodiment of the present invention is directed to an array substrate including a substrate and the above thin film transistor disposed on the substrate.

In yet another aspect, an embodiment of the present invention is directed to a display device including the above array substrate, an opposite substrate, and a display layer therebetween.

The foregoing presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later. Many of the attendant features will be more readily appreciated as the same becomes better understood by reference to the following detailed description considered in connection with the accompanying drawings.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiment 1

Figure 1A:
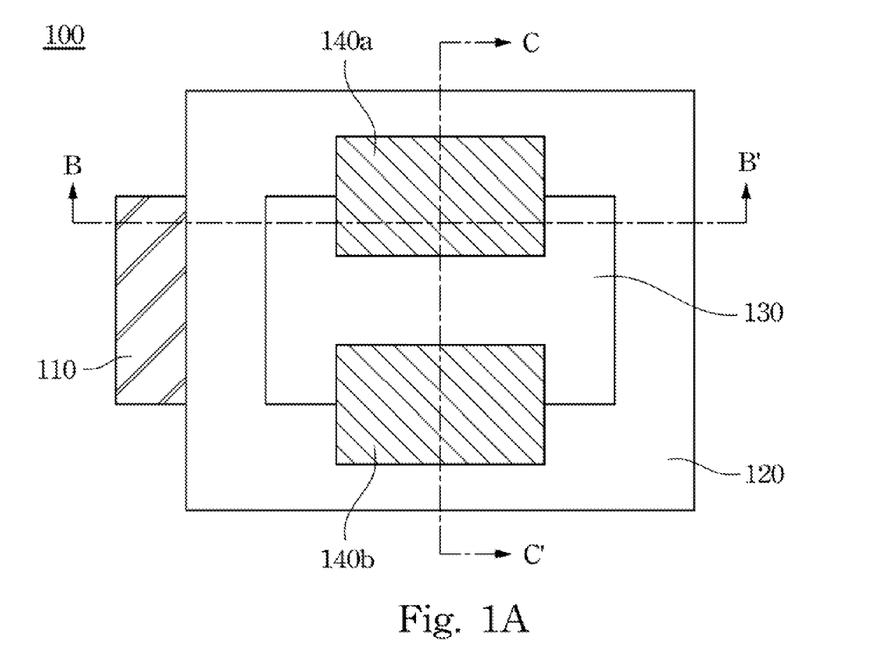
FIG. 1A is a top view of a thin film transistor according to one embodiment of this invention.

FIG. 1A is a top view of a thin film transistor according to one embodiment of this invention. In FIG. 1A, the thin film transistor (TFT) 100 comprises a gate 110, a gate insulating layer 120, a semiconductor layer 130, a source 140a, and a drain 140b.

Figure 1B:
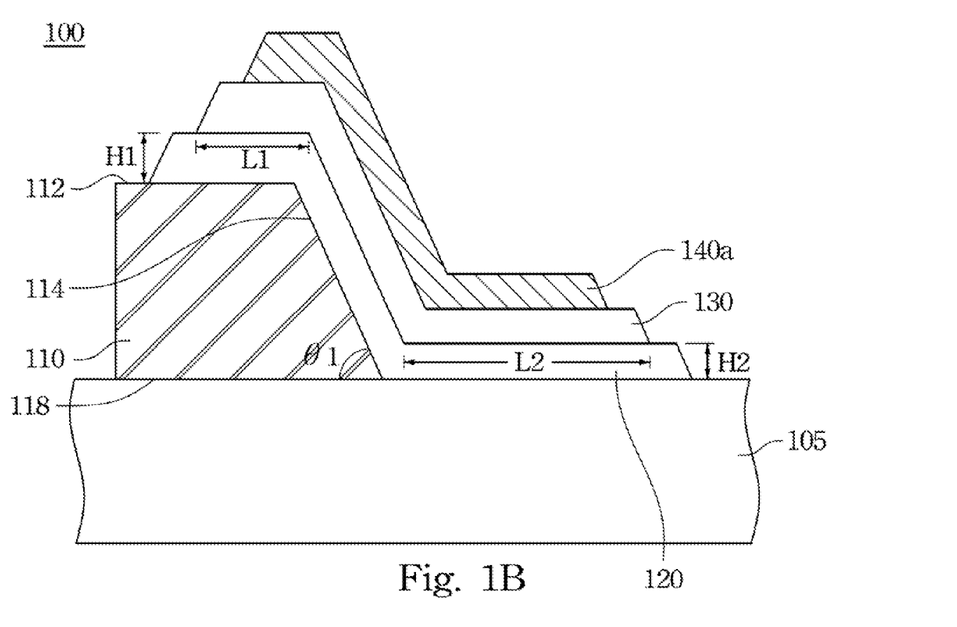
FIG. 1B is a cross-sectional diagram of cutting line B-B in FIG. 1A.

FIG. 1B is a cross-sectional diagram of cutting line B-B' in FIG. 1A. In FIG. 1B the gate 110 is disposed on a substrate 105. The gate 110 has a top surface 112, a first lateral surface 114 connecting the substrate 105 and the top surface 112, and a bottom surface 118 being adjacent to the substrate 105.

The angle θ1 between the first lateral surface 114 and the bottom surface 118 is about 45°-90°. The angle θ1 is determined by the step coverage of the subsequently deposited thin film. The angle θ1 is needed to be smaller when the step coverage is poorer. On the contrary, the angle θ1 is needed to be larger when the step coverage is better.

The thickness of the gate 110, i.e. the vertical distance from the top surface 112 to the bottom surface 118, is about 0.1-5 μm. The thickness of the gate 110 will directly affect the channel width of the TFT 100. The thicker the gate is, the wider the channel is. On the contrary, the channel is narrower. The channel width affects the working current and the charging/discharging rate of the TFT 100.

Figure 1C:
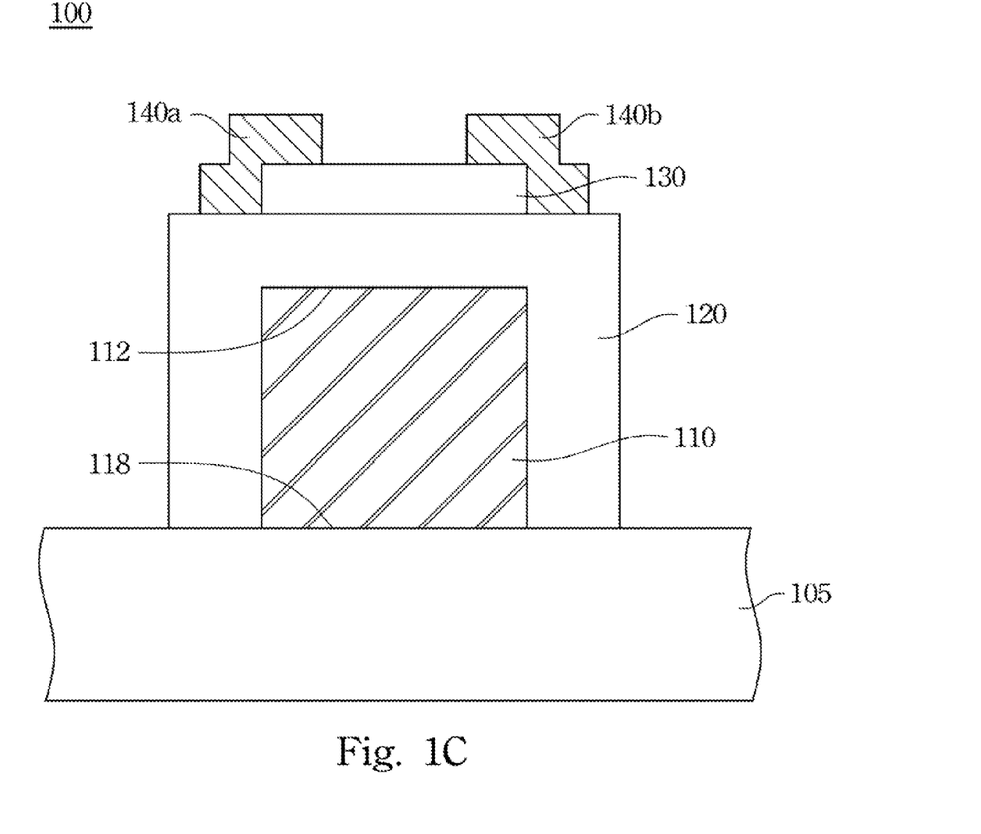
FIG. 1C is another cross-sectional diagram of cutting line C-C' in FIG. 1A.

Please also refer to FIG. 1C for describing the disposition of the gate insulating layer 120. FIG. 1C is another cross-sectional diagram of cutting line C-C' in FIG. 1A. In FIGS. 1B and 1C, the conformal gate insulating layer 120 extends from the top surface 112 of the gate 110, passes the first lateral surface 114, and reaches to the top surface of the substrate 105.

The thickness of the gate insulating layer 120 is about 300-400 nm. According to an embodiment, the thickness H1 of the gate insulating layer 120 on the top surface 112 of the gate 110 is thicker than the thickness H2 of the gate insulating layer 120 on the substrate 105. In some other embodiments, the thickness H1 can also equal to the thickness H2. The material of the gate insulating layer 120 can be silicon oxide, silicon nitride, aluminum oxide, of hafnium oxide, for example.

The semiconductor layer 130 conformably covers the gate insulating layer 120. In FIG. 1B, the length of the semiconductor layer 130 on the top surface 112 of the gate 110 is L1. Since this part (L1) of the semiconductor layer 130 and the gate 110 are separated by only one gate insulating layer 120, this part (L1) of the semiconductor layer 130 may contribute to the channel width of TFT 100. That is, the larger the L1 value is, the wider the channel is. On the contrary, the smaller the L1 value is, the narrower the channel is.

The length of the semiconductor layer 130 away from the gate 110 and on the substrate 105 is L2. Since the distance between this part (L2) of the semiconductor layer 130 and the gate 110 is longer, the influence of this part (L2) of the semiconductor layer 130 to the channel width of TFT 100 is smaller when L2 is longer. Moreover, if the length L2 is too large, a problem of current leakage will occur.

According to an embodiment, the thickness of the semiconductor layer 130 is about 20-200 nm. The charge carrier mobility of the semiconductor layer 130 is at least 5 $cm^2/Vs$. Hence, the material of the semiconductor layer 130 is metal oxide semiconductor material or polycrystalline silicon.

In FIG. 1A, the source 140a and the drain 140b are respectively disposed on the semiconductor layer 130 and located at two opposite sides of the semiconductor layer 130. In FIG. 1B, the source 140a and the drain 140b are majorly disposed on the first lateral surface 114 of the gate 110, and at the same height relative to the substrate 105.

The semiconductor layer 130 between the source 140a and the drain 140b is used as the channel of the TFT 100. From FIG. 1B it can be known that the channel between the source 140a and the drain 140b is majorly disposed on the first lateral surface 114 of the gate 110. Furthermore, since the angle $\theta 1$ between the first lateral surface 114 and the bottom surface 118 is about 45°-90° although the channel width is increased to increase the performance of the thin film transistor 100, the increase in the area of the substrate 105 occupied by the thin film transistor 100 is also very limited.

Embodiment 2

Figure 2A:
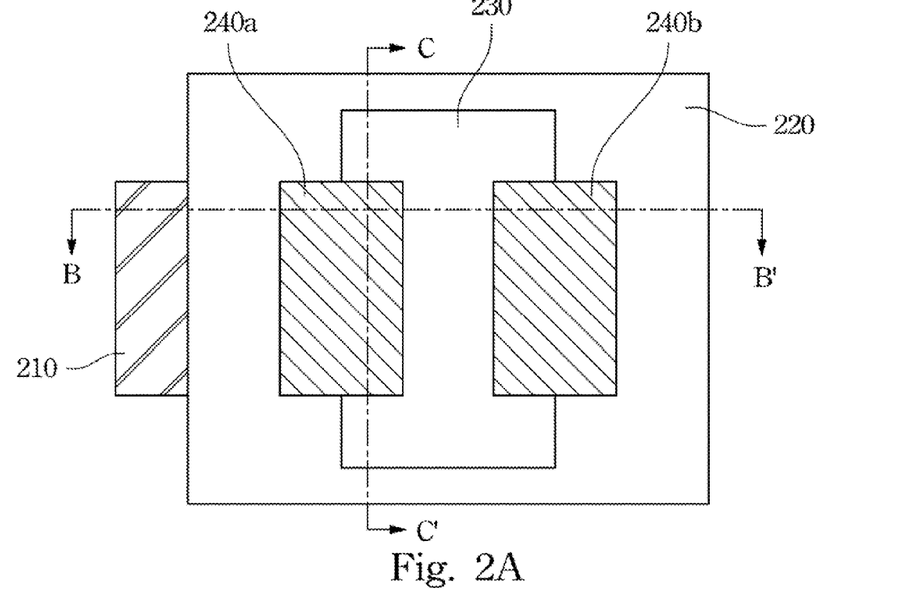
FIG. 2A is a top view of another thin film transistor according to another embodiment of this invention.

The major difference between the thin film transistor (TFT) 200 of embodiment 2 and the TFT 100 of embodiment 1 is the disposition direction of the source 240a and drain 240b. The details are described as following. FIG. 2A is a top view of another thin film transistor according to another embodiment of this invention. In FIG. 2A, the thin film transistor (TFT) 200 includes a gate 210, a gate insulating layer 220, a semiconductor layer 230, a source 240a, and a drain 240b.

Figure 2B:
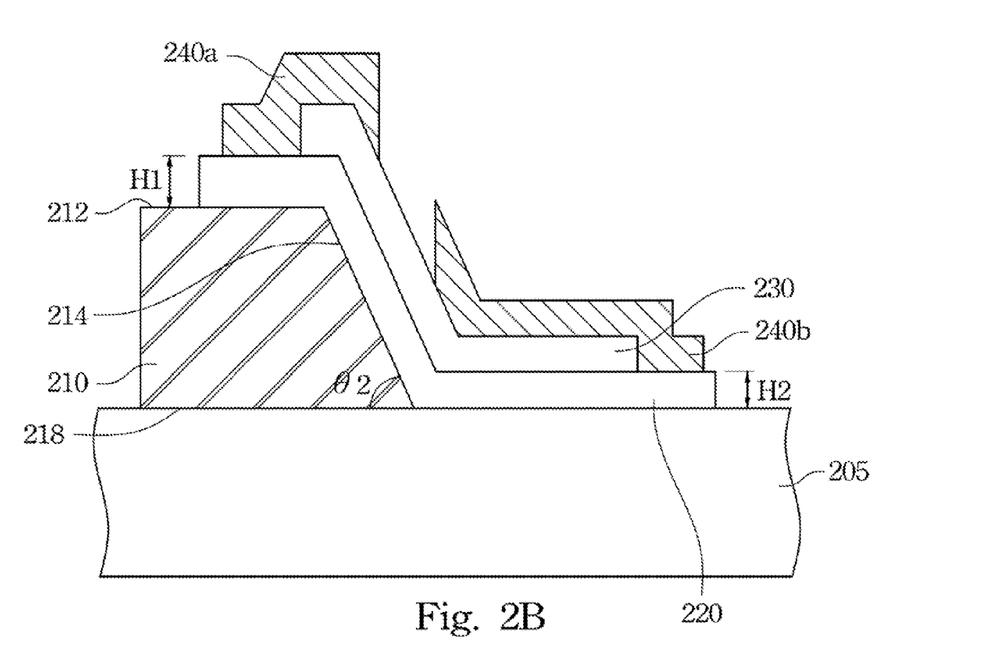
FIG. 2B is a cross-sectional diagram of cutting line B-B' in FIG. 2A.

FIG. 2B is a cross-sectional diagram of cutting line B-B' in FIG. 2A, FIG. 2B, the gate 210 is disposed on the substrate 205. The gate 210 has a top surface 212, a first lateral surface 214 connecting the substrate 205 and the op surface 212, and a bottom surface 218 being adjacent to the substrate 205.

The angle $\theta 2$ between the first lateral surface 214 and the bottom surface 218 is about 45°-90°. The angle $\theta 2$ is determined by the step coverage of the subsequently deposited thin film. The angle $\theta 2$ is needed to be smaller when the step coverage is poorer. On the contrary, the angle $\theta 2$ is needed to be larger when the step coverage is better.

The thickness of the gate 210, i.e. the vertical distance from the top surface 212 to the bottom surface 218, is about 0.1-5 μm. The thickness of the gate 110 will directly affect the channel width of the TFT 200.

Figure 2C:
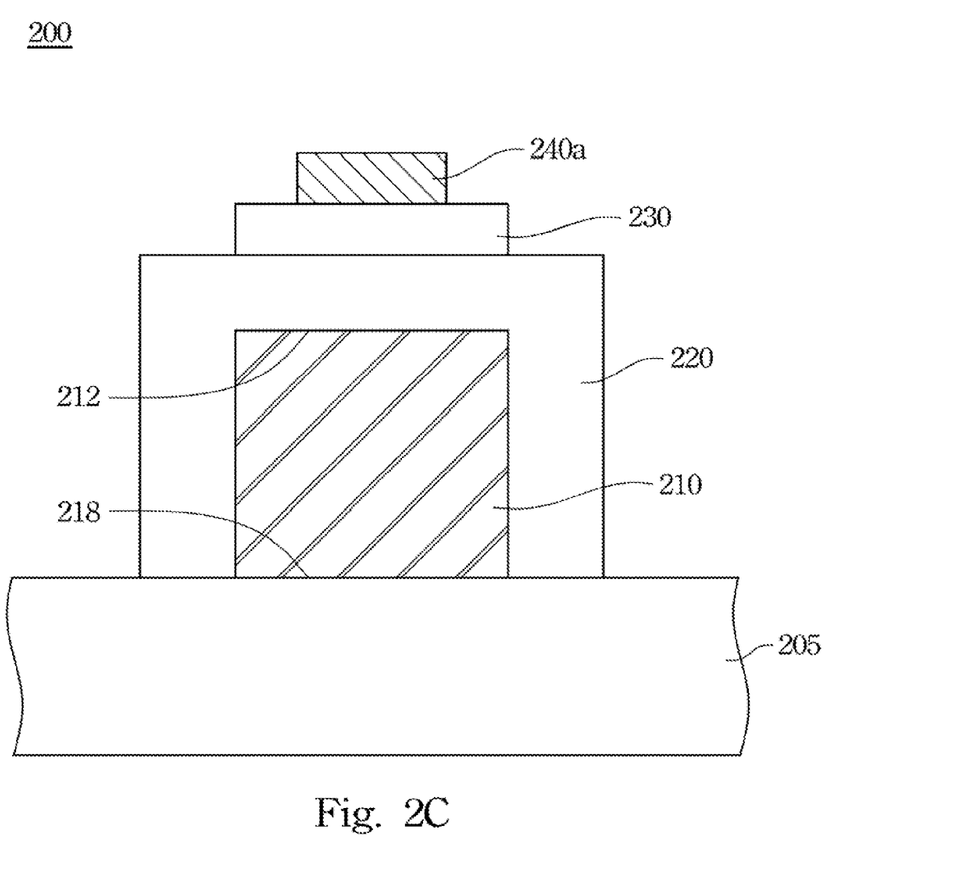
FIG. 2C is another cross-sectional diagram of cutting line C-C' in FIG. 2A.

Please also refer to FIG. 2C for describing the disposition of the gate insulating layer 220. FIG. 2C is another cross-sectional diagram of cutting line C-C' in FIG. 2A. In FIGS. 2B and 2C, the conformal gate insulating layer 220 extends from the top surface 212 of the gate 210, passes the first lateral surface 214, and reaches to the top surface of the substrate 205.

The thickness of the gate insulating layer 220 is about 300-400 nm. According to an embodiment, the thickness H1 of the gate insulating layer 220 on the top surface 212 of the gate 210 is thicker than the thickness H2 of the gate insulating layer 220 on the substrate 205. In some other embodiments, the thickness H1 can also equal to the thickness H2. The material of the gate insulating layer 220 can be silicon oxide, silicon nitride, aluminum oxide, of hafnium oxide, for example.

The semiconductor layer 230 conformably covers the gate insulating layer 220. According to an embodiment, the thickness of the semiconductor layer 230 is about 20-200 nm. The charge carrier mobility of the semiconductor layer 230 is at least 5 $cm^2/Vs$. Hence, the material of the semiconductor layer 230 is metal oxide semiconductor material or polycrystalline silicon.

In FIG. 2A, the source 240a and the drain 240b are respectively disposed on the semiconductor layer 230 and located at two opposite sides of the semiconductor layer 230. In FIG. 2B, the source 240a and the drain 240b are majorly disposed on two opposite ends of the first lateral surface 214 of the gate 210, and at different height relative to the substrate 205.

The semiconductor layer 230 between the source 240a and the drain 240b is used as the channel of the TFT 200. From FIG. 26, it can be known that the channel between the source 240a and the drain 240b is majorly disposed on the first lateral surface 214 of the gate 210. Furthermore, since the angle $\theta 2$ between the first lateral surface 214 and the bottom surface 218 is about 45°-90°, although the channel width is increased to increase the performance of the thin film transistor 200, the increase in the area of the substrate 205 occupied by the thin film transistor 200 is also very limited.

Display Device

The TFT 100 of embodiment 1 and the TFT 200 of the embodiment 2 can be applied on manufacturing array substrates of display devices.

Figure 3:
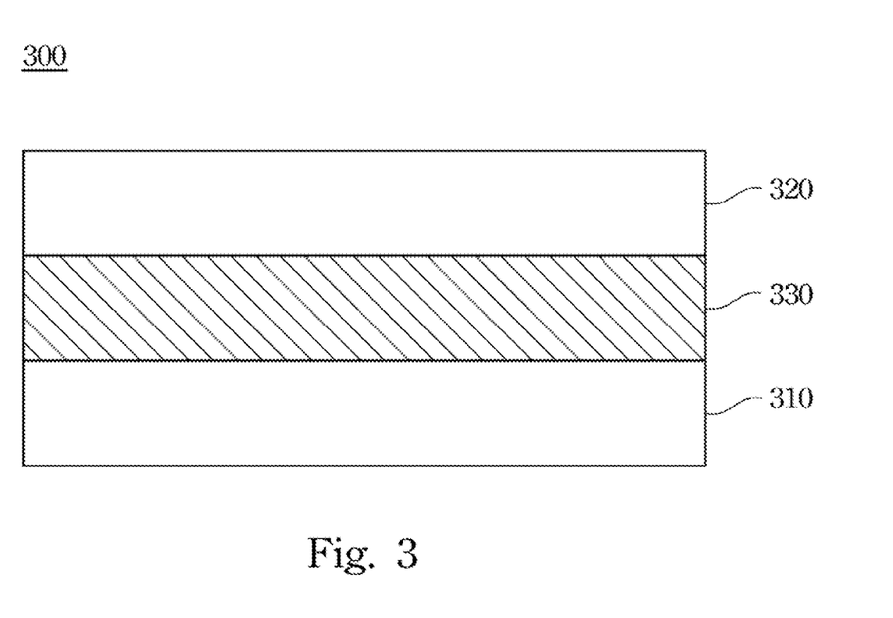
FIG. 3 is a cross-sectional diagram of a display device.

FIG. 3 is a cross-sectional diagram of a display device. In FIG. 3, the display device 300 has an array substrate 310, an opposite substrate 320, and a display layer 330 therebetween. The array substrate 310 has a TFT array composed of the above TFT 100, the TFT 200 or the both. The opposite substrate 320 is disposed opposite to the array substrate 310. The above display layer 330 can be an electronic ink layer, a liquid crystal layer, or a layer of any other useable di splay materials.

In light of the foregoing, an increased gate thickness, as well as the gate insulating layer, the semiconductor layer, the source and the drain conformably stacked together are utilized to make the channel of the TFT be majorly disposed on the lateral surface of the gate. Since the angle between the lateral surface and the bottom surface of the gate is about 45°-90°, the channel's area projected onto the substrate can be effectively decreased to effectively decrease the area occupied by the TFT. Therefore, the aperture ratio and thus the brightness of the display devices can be effectively increased.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A thin film transistor, comprising:
   a gate disposed on a substrate and having a first lateral surface connecting the substrate;
   a gate insulating layer having a second lateral surface conformally formed on the first lateral surface of the gate;
   a semiconductor layer disposed on the gate insulating layer, wherein the semiconductor layer has an inclined surface conformally formed on the second lateral surface of the gate insulating layer such that the first lateral surface, the second lateral surface and the inclined surface constitute a conformally stacked structure; and
   a source and a drain respectively disposed on the semiconductor layer, located at two opposite sides of the conformally stacked structure of the first lateral surface, the second lateral surface of the inclined surface, wherein the source is spaced apart from the drain by a gap exposing the inclined surface of the semiconductor layer, and the inclined surface of the semiconductor layer interconnects the source and the drain.

2. The thin film transistor of claim 1, wherein the source and the drain cover the fist lateral surface of the gate, and are on the same height relative to the substrate.

3. The thin film transistor of claim 1, wherein the source and the drain are disposed on two opposite ends of the first lateral surface, and on different height relative to the substrate.

4. The thin film transistor of claim 1, wherein a thickness of the gate is about 0.1-5 μm.

5. The thin film transistor of claim 1, wherein an angle between the first lateral surface and a bottom surface of the gate is about 45°-90°, and the bottom surface of the gate is adjacent to the substrate.

6. The thin film transistor of claim 1, wherein charge carrier mobility of the semiconductor layer is at least 5 $cm^2/Vs$.

7. The thin film transistor of claim 1, wherein a material of the semiconductor layer is metal oxide semiconductor material or polycrystalline silicon.

8. The thin film transistor of claim 1. wherein a thickness of the semiconductor layer is about 20-200 nm.

9. The thin film transistor of claim 1, wherein a thickness of the gate insulating layer is about 300-400 nm.

10. An array substrate, comprising:
    a substrate; and
    a thin film transistor disposed on the substrate, wherein the thin film transistor comprises:
       a gate disposed on a substrate and having a first lateral surface connecting the substrate;
       a gate insulating layer having a second lateral surface conformally formed on the first lateral surface of the gate;
       a semiconductor layer disposed on the gate insulating layer, wherein the semiconductor layer has an inclined surface conformally formed on the second lateral surface of the gate insulating layer such that the first lateral surface, the second lateral surface and the inclined surface constitute a conformally stacked structure; and
       a source and a drain respectively disposed on the semiconductor layer, located at two opposite sides of the conformally stacked structure of the first lateral surface, the second lateral surface and the inclined surface, wherein the source is spaced apart from the drain by a gap exposing the inclined surface of the semiconductor layer, and the inclined surface of the semiconductor layer interconnects the source and the drain.

11. The array substrate of claim 10, wherein the source and the drain cover the fist lateral surface of the gate, and are on the same height relative to the substrate.

12. The array substrate of claim 10, wherein the source and the drain are disposed on two opposite ends of the first lateral surface, and on different height relative to the substrate.

13. The array substrate of claim 10, wherein a thickness of the gate is about 0.1-5 μm.

14. The array substrate of claim 10, wherein an angle between the first lateral surface and a bottom surface of the gate is about 45°-90°, and the bottom surface of the gate is adjacent to the substrate.

15. The array substrate of claim 10, wherein charge carrier mobility in the semiconductor layer is at least 5 $cm^2/Vs$.

16. A display device, comprising:
    an array substrate, comprising:
       a substrate; and
       a thin film transistor disposed on the substrate, wherein the thin film transistor comprises:
          a gate disposed on a substrate and having a first lateral surface connecting the substrate;
          a gate insulating layer having a second lateral surface conformally formed on the first lateral surface of the gate;
          a semiconductor layer disposed on the gate insulating layer wherein the semiconductor layer has an inclined surface conformally formed on the second lateral surface of the gate insulting layer such that the first lateral surface, the second lateral surface and the inclined surface constitute a conformally stacked structure; and
          a source and a drain respectively disposed on the semiconductor layer, located at two opposite sides of the conformally stacked structure of the first lateral surface, the second lateral surface and the inclined surface, wherein the source is spaced apart from the drain by a gap exposing the inclined surface of the semiconductor layer, and the inclined surface of the semiconductor layer interconnects the source and the drain:
    an opposite substrate disposed opposite to the array substrate; and
    a display layer between the array substrate and the opposite substrate.

17. The display device of claim 16, wherein the source and the drain cover the fist lateral surface of the gate, and are on the same height relative to the substrate.

18. The display device of claim 16, wherein the source and the drain are disposed on two opposite ends of the first lateral surface, and on different height relative to the substrate.

19. The display device of claim 16, wherein a thickness of the gate is about 0.1-5 μm.

20. The display device of claim 16, wherein an angle between the first lateral surface and a bottom surface of the gate is about 45°-90°, and the bottom surface of the gate is adjacent to the substrate.

* * * * *